United States Patent
Zogopoulos et al.

(10) Patent No.: US 9,825,620 B2
(45) Date of Patent: Nov. 21, 2017

(54) METHOD AND APPARATUS FOR DIGITAL UNDERVOLTAGE DETECTION AND CONTROL

(71) Applicant: Apple Inc., Cupertino, CA (US)

(72) Inventors: Sotirios Zogopoulos, Los Altos, CA (US); Joseph T. DiBene, II, Santa Cruz, CA (US); Jafar Savoj, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 174 days.

(21) Appl. No.: 15/002,495

(22) Filed: Jan. 21, 2016

(65) Prior Publication Data

US 2017/0214399 A1    Jul. 27, 2017

(51) Int. Cl.
*G06F 1/20* (2006.01)
*H03K 5/19* (2006.01)
*H03K 3/03* (2006.01)
*H03K 5/02* (2006.01)
*H03K 5/24* (2006.01)
*H03K 5/26* (2006.01)
*G06F 1/32* (2006.01)
*G06F 1/26* (2006.01)
(Continued)

(52) U.S. Cl.
CPC ............ *H03K 5/19* (2013.01); *G06F 1/324* (2013.01); *G06F 1/3206* (2013.01); *H03K 3/0315* (2013.01); *H03K 5/02* (2013.01); *H03K 5/24* (2013.01); *H03K 5/26* (2013.01); *G06F 1/26* (2013.01); *G06F 1/28* (2013.01); *G06F 1/30* (2013.01); *G06F 1/305* (2013.01)

(58) Field of Classification Search
None
See application file for complete search history.

(56) References Cited

U.S. PATENT DOCUMENTS 6,882,238 B2    4/2005    Kurd et al.
6,924,710 B2    8/2005    Wong et al.
(Continued)

FOREIGN PATENT DOCUMENTS

WO    2015/200310    12/2015

OTHER PUBLICATIONS

International Search Report in application No. PCT/US2017/013016 dated Apr. 20, 2017.

*Primary Examiner* — Tuan T Lam
(74) *Attorney, Agent, or Firm* — Meyertons, Hood, Kivlin, Kowert & Goetzel, P.C.; Erik A. Heter

(57) ABSTRACT

A method and apparats for undervoltage detection and correction is disclosed. An IC includes sensors implemented in various functional circuit blocks. The sensors are implemented using ring oscillators, and may be characterized by a polynomial. The sensors are used to monitor a supply voltage provided to a corresponding functional unit. The sensors provide information indicative of the voltage on the supply voltage node over successive clock cycles. Comparison circuitry may be used to compare the detected voltage to one or more voltage thresholds, while delta comparison circuitry may be used to determine a slope, or rate of change of the voltage. Based on comparisons performed by the comparison circuitry and the delta comparison circuitry, control circuitry may determine if one or more voltage correction actions are to be taken in order to bring the voltage on the supply node into a specified range.

20 Claims, 10 Drawing Sheets

(51) Int. Cl.
  *G06F 1/28*   (2006.01)
  *G06F 1/30*   (2006.01)

(56) References Cited

U.S. PATENT DOCUMENTS

| | | | |
|---|---|---|---|
| 7,209,401 B2 | 4/2007 | Norman et al. | |
| 7,859,421 B2* | 12/2010 | Berthold | G01R 19/16552 331/173 |
| 2008/0122524 A1* | 5/2008 | Barrows | G06F 17/5063 327/537 |
| 2009/0300329 A1 | 12/2009 | Naffziger | |
| 2011/0055596 A1 | 3/2011 | Wyatt | |
| 2011/0074398 A1 | 3/2011 | Barton | |
| 2011/0169563 A1* | 7/2011 | Bhaumik | G06F 1/3203 327/544 |
| 2011/0241423 A1* | 10/2011 | Bridges | G06F 1/305 307/31 |
| 2012/0005515 A1* | 1/2012 | Reddi | G06F 1/28 713/340 |
| 2013/0043916 A1* | 2/2013 | Sippel | H03K 3/0315 327/149 |
| 2013/0110437 A1 | 5/2013 | Singh et al. | |
| 2014/0022008 A1* | 1/2014 | Noorlag | G06F 1/26 327/540 |
| 2014/0240658 A1* | 8/2014 | Pugh | G02C 7/04 351/159.03 |
| 2015/0102833 A1* | 4/2015 | Bhatia | G01R 31/2884 324/762.01 |
| 2016/0003893 A1* | 1/2016 | Ibrahimovic | G06F 1/26 324/537 |
| 2016/0285434 A1* | 9/2016 | Menon | H01L 23/58 |

\* cited by examiner

METHOD AND APPARATUS FOR DIGITAL UNDERVOLTAGE DETECTION AND CONTROL

BACKGROUND

Technical Field

This disclosure is directed to integrated circuits, and more particularly, to monitoring and controlling supply voltages during the operation of an integrated circuit.

Description of the Related Art

As features sizes have decreased, the number of transistors on integrated circuits (ICs) has correspondingly increased. The increased number of transistors per unit area has resulted in a corresponding increase in thermal output of ICs. Furthermore, the increased number of transistors per unit area has also corresponded to a decrease in the supply voltages provided to various functional circuitry on an IC. This has in turn led to significant challenges in balancing performance, power consumption, and thermal output of ICs. To this end, many ICs implement subsystems that monitor various metrics of the IC (e.g., temperature, voltage, voltage droops) and adjust the performance based on received measurements.

IC subsystems used to monitor system metrics typically include one or more sensors and at least one control system. Due to factors such as process, voltage, and temperature variations, at least the sensors of such a subsystem may be coupled to receive power from a supply different from that used to power functional circuitry in the IC. For example, some ICs use an analog power supply that is separate from those supplies used to provide power to functional circuitry. This may provide some degree of isolation of the sensors from variations induced into the supplies that provide power to functional circuity on the IC.

SUMMARY

A method and apparats for undervoltage detection and correction is disclosed. In one embodiment, an integrated circuit (IC) includes a number of sensors implemented in various functional circuit blocks. The sensors may be implemented using ring oscillators, and may be characterized by a polynomial. The sensors are used to monitor a supply voltage provided to the functional unit in which they are implemented. The sensors may provide information indicative of the voltage on the supply voltage node over each of a number of successive clock cycles. Comparison circuitry may be used to compare the detected voltage to one or more voltage thresholds, while delta comparison circuitry may be used to determine a slope, or rate of change of the voltage. Based on comparisons performed by the comparison circuitry and the delta comparison circuitry, control circuitry may determine if one or more voltage correction actions are to be taken in order to bring the voltage on the supply node into a specified range.

In various embodiments, the sensors may be implemented using ring oscillators. In one embodiment, each sensor may include two separate ring oscillators having different characteristics. The different characteristics may be indicated by respective characteristic polynomials. Frequencies may be obtained from both ring oscillators, and voltage and, using the respective characteristic polynomials, computation circuitry may solve for voltage. In another embodiment, a single ring oscillator may be implemented with specially configured inverters capable of receiving variable input and bias voltages. Voltage and temperature may be determined using s multiple sensing technique.

Any voltage correction actions to be taken to bring the supply voltage back to within a specified range may be determined based on a number of comparisons. During each clock cycles, the voltage on a supply voltage node detected by a given sensor may be compared to one or more voltage thresholds. Additionally, over successive clock cycles, a slope (or rate of change of the voltage) may be compared to one or more slope thresholds. Based on these multiple comparisons, different actions may be taken. For example, if the voltage is below a specified threshold (indicating that it is out of range) but the slope is below a certain threshold (indicating that it is not declining or is actually increasing back toward its specified range), a first voltage correction action may be taken. In a second example, if the voltage is below a threshold and the slope is above a certain threshold (indicating that it is declining rapidly) a second voltage correction action may be taken. In yet a third example, if the voltage is above a certain threshold value (indicating it is within a specified range), but the slope comparison indicates that the voltage is declining rapidly (and thus, will fall out of range if no action is taken), a third voltage correction action may be taken. Voltage correction actions may include, but are not limited to, throttling a clock signal provided to a functional circuit block, increasing an amount of current provided to the functional circuit block, or adaptive clocking of the functional circuit block. Furthermore, multiple actions may be performed concurrently depending on both the value of the most recently detected voltage and the trend as determined by the delta comparison operation.

BRIEF DESCRIPTION OF THE DRAWINGS

The following detailed description makes reference to the accompanying drawings, which are now briefly described.

Figure 1:
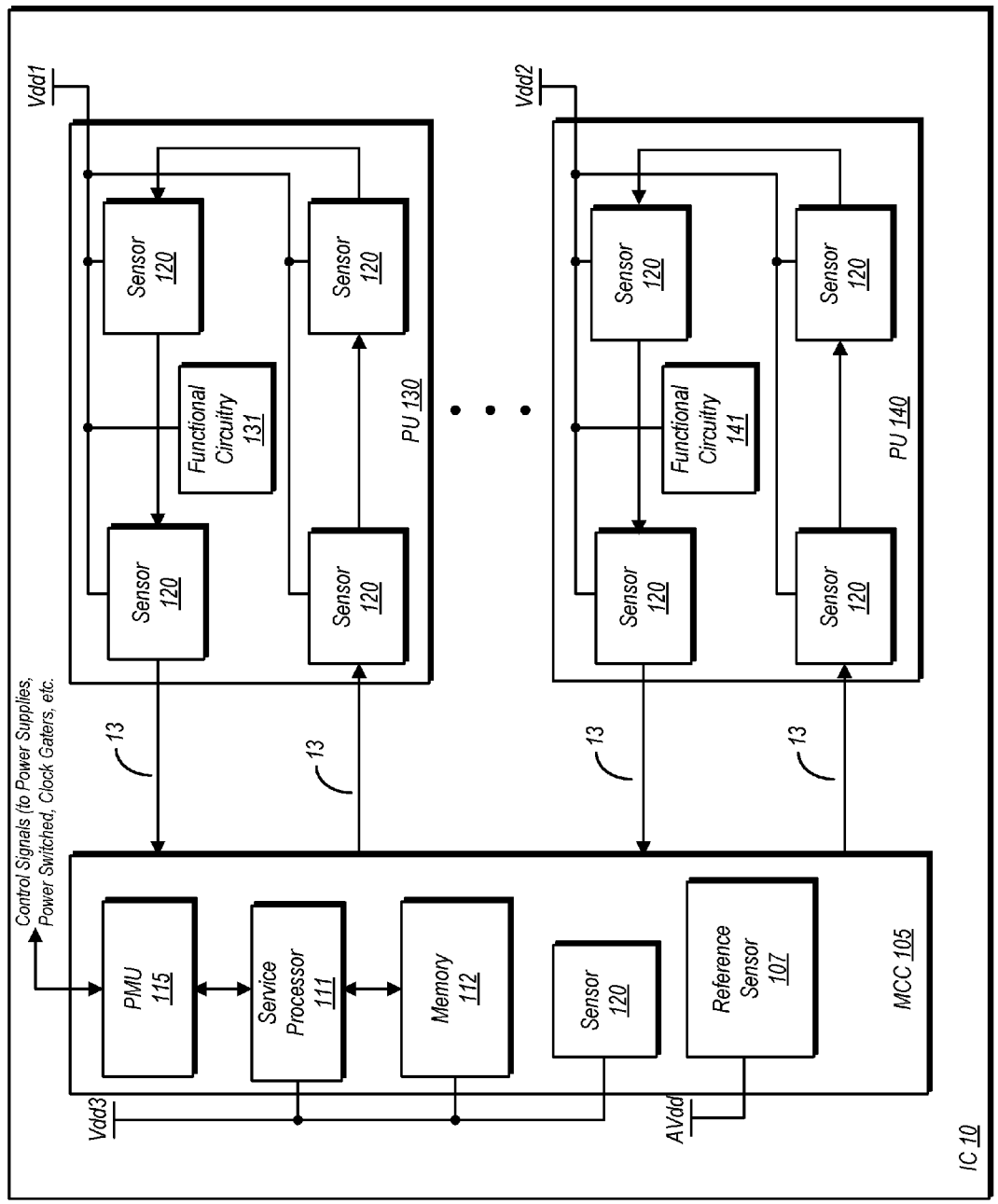
FIG. 1 is a block diagram of one embodiment of an IC.

While the disclosed subject matter is susceptible to various modifications and alternative forms, specific embodiments thereof are shown by way of example in the drawings and will herein be described in detail. It should be understood, however, that the drawings and detailed description thereto are not intended to limit the subject matter to the particular form disclosed, but on the contrary, the intention is to cover all modifications, equivalents and alternatives falling within the spirit and scope of the disclosed subject matter as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) (or pre-AIA paragraph six) interpretation for that unit/circuit/component.

DETAILED DESCRIPTION OF EMBODIMENTS

Turning now to FIG. 1, a block diagram of one embodiment of an IC is shown. In the embodiment shown, IC 10 includes two functional circuit blocks, processing unit (PU) 130, and PU 140. In various embodiments, other functional circuit blocks may be included, including additional instances of PU 130. PU 130 and PU 140 are thus shown here as exemplary functional circuit blocks, but are not intended to limit the scope of this disclosure. Each of PU 130 and 140 may be a general purpose processor core, a graphics processing unit, a digital signal processing unit, or virtually any other kind of functional unit configured to perform a processing function. The scope of this disclosure may apply to any of these types of functional circuit blocks, as well as other not explicitly mentioned herein. The number of functional circuit blocks shown here is exemplary as well, as the disclosure is not limited to any particular number.

PU 130 in the embodiment shown is a general purpose processor core configured to execute the instructions of an instruction set and perform general purpose processing operations. Functional circuitry 131 of PU 130 may thus include various types of circuitry such as execution units of various types (integer, floating point, etc.), register files, schedulers, instruction fetch units, various levels of cache memory, and other circuitry that may be implemented in a processor core. PU 130, and all circuitry therein, is coupled to receive supply voltage Vdd1 in this embodiment. It is noted however that multiple power domains, and thus multiple supply voltages, may be implemented within various embodiments of PU 130. Furthermore, supply voltages provided to PU 130 may be variable under the control of power management circuitry (not shown). The power management circuitry adjusts the voltages for various reasons, such as controlling performance levels, thermal output, and power consumption.

PU 140 in the illustrated embodiment includes functional circuitry 141, which may implement various types of processing circuitry such as graphics processing circuitry which, in some embodiments, may include graphics processing cores, various types of memory and registers, and so on. PU 140 in the embodiment shown is coupled to receive a second supply voltage, Vdd2 that is separate from Vdd1 as received by PU 130.

Both PU 130 and PU 140 include a number of sensors 120. The particular number of sensors shown here is exemplary, and in actual embodiments may be greater, lesser, or equal. The sensors 120 may be configured for sensing one or more performance metrics, or parameters. In this particular embodiment, the sensors are configured to sense voltage and temperature values. The sensed voltage and temperature values may in turn be used to determine whether or not circuitry implemented therein is operating within limits and/or is capable of higher performance.

Each of the sensors 120 in the embodiment shown is coupled to the same voltage supply as the functional circuitry in its respective one of the functional circuit blocks. That is, each sensor 120 in PU 130 is coupled to receive a supply voltage Vdd1, while each sensor in PU 140 is coupled to receive Vdd2. In prior art embodiments, such sensors are typically coupled to receive power from a supply separate from that of the functional circuitry near which they are implemented. This may limit their placement within an IC/functional circuit block due to the need to route connections for another voltage supply. Furthermore, the sensors in prior art embodiments may typically be larger than those used in the embodiments discussed herein, which may further limit their number and placement. In contrast, the sensors 120 implemented herein may be simplified sensors. Accordingly, sensors 120 may be smaller than prior art sensors. This in turn may allow more sensors to be place on an IC. Furthermore, the sensors may be placed in smaller areas, increasing the versatility of their implementation. In one embodiment, sensors 120 may be implemented using one or more ring oscillators. However, since the frequency produced by a ring oscillator may show a significant dependence on process, voltage, and temperature variations, the ring oscillators may be calibrated such that these dependencies do not adversely affect their accuracy. Various calibration and operation methodologies are discussed in further detail below. It is noted that an initial calibration (and characterizations) for each sensor may be performed during a test using automated test equipment (ATE) at known voltages and temperatures. Subsequent calibrations may be performed during startup and/or operation of the system in which IC 10 is implemented.

IC 10 in the embodiment shown includes metrology control circuitry (MCC) 105. MCC 105 may perform various operations involved with operation of the sensors 120 in the various functional circuit blocks of IC 10. In the embodiment shown, MCC 105 is coupled to each of the sensors 120 via a metrology bus 13. During operation of IC 10, each of the sensors 120 may perform readings of, e.g., a frequency of their respective ring oscillator(s), convert the frequency reading into a digital format, and transmit that information to MCC 105. In this embodiment, MCC 105 is a serial bus, and information may be shifted on the bus in operation that is similar to that of a scan chain. However, embodiments utilizing different mechanisms for communications with the sensors are possible and contemplated.

MCC 105 also includes a power management unit (PMU) 115, which implements circuitry that may enable various power control actions to be performed. Some of these power control actions may be performed based on readings obtained from sensors 120. In one embodiment, responsive to determining undervoltage condition (e.g., a voltage "droop") on a power supply node that provides power to one of PU's 130 or 140 (or more generally, any functional circuit block), PMU 115 may perform actions to cause the voltage on the supply node to return to within a specified range.

Although not shown here, IC 10 may include one or more clock generation circuits and a number of clock gating circuits at various levels of a clock tree. PMU 115 in the embodiment shown is configured to generate signals that can be provided to the clock generation circuit and the clock gating circuits to perform various actions, such as the throttling of a clock signal, the inhibiting of a clock signal for a predetermined time (through gating at one or more levels of the clock tree), and altering the frequency of the clock signal.

IC 10 may also include either an on-chip power supply, one or more on-chip voltage regulators, or both (also not shown here). PMU 115 may generate various control signals for provided to either or both of the power supply and voltage regulator(s) for controlling how power is provided to the various processing units (or more generally, functional circuit blocks). The various actions that may be caused using control signals generated by PMU 115 include power gating, controlling a voltage provided on a voltage supply node, and controlling an amount of current provided to a functional circuit block.

The various actions performed by PMU 115 may be based on signals received from a service processor 111, which is discussed in more detail below. In one embodiment, service processor 111 may provide a digital code indicating which action or combinations of actions are to be performed, and which of the functional circuit blocks are to be the targets of such actions. As will also be discussed below, service processor 111 may generate these codes based on readings obtained from the various sensors 120 in IC 10. Generally speaking, PMU 115 and service processor 111 may, taken in conjunction, implement control circuitry that can determine if any power control actions are to be taken based on sensed information, which control actions are to be taken, and to generate signals to cause the control actions to be taken. This is discussed below in the context of the embodiments illustrated in the drawings. However, it is to be understood that implementations of such circuitry may vary widely from one embodiment to the next while still falling within the scope of this disclosure. Accordingly, the embodiments discussed herein are exemplary, but are not intended to be limiting.

MCC 105 may receive the frequency information from each of the sensors 120 via their correspondingly coupled instances of metrology bus 13. Using the frequency information, MCC 105 may determine a voltage and temperature sensed by each of sensors 120. In the embodiment shown, MCC 105 includes service processor 111 and a memory 112 coupled thereto. Service processor 111 may perform a number of functions in determining the value of readings received from the various sensors 120, as well as determining whether certain actions are to be taken based on the readings. In one embodiment, service processor may implement circuitry that calculates voltage and temperature sensed by each of the sensors 120, performs various comparison operations, and provides indications (in the form of digital codes) to PMU 115 of any power control actions that are to be taken, including those that are performed to correct undervoltage conditions. In some cases, such circuitry may be implemented as general purpose processing circuitry that executes instructions to perform the various tasks of determining the sensed values, performing comparisons to various thresholds, and determining control actions to be taken by PMU 115. In other embodiments, the actions above may be carried out by hardwired circuitry. Generally speaking, the calculation, comparison, and code generation functions may be performed by any suitable combination of hardware circuits, firmware, and/or software instructions that are executed in service processor 111. Accordingly, any exemplary circuits shown herein may be implemented using hardwired circuitry configured for performing a specific task, or as general purpose processing circuitry that executes instructions received from software and/or firmware.

Service processor 111 may, in one embodiment, execute instructions of a software routine to solve for voltage and temperature values based on frequency information received from each of the sensors 120. Embodiments in which dedicated circuitry performs these task in lieu of the execution of software instructions are also possible and contemplated. Memory 112 may be used by service processor to store various information, including the frequency information received from the sensors, the determined voltage and temperature information, and intermediate information generated during the performance of calculations. Memory 112 may also store information characterizing the sensors and the circuitry therein (e.g., the ring oscillators). During certain operations, memory 112 may store temporary or previous calculation results (e.g., if historical results are desired). Memory 112 may be implemented using volatile memory, non-volatile memory, or a combination thereof.

Service processor 111 may perform additional operations using the results of the calculated voltages and temperatures. Among these operations is the determining if a voltage droop on a voltage supply node has occurred or is imminent. A voltage droop as defined herein may occur when the voltage present on a supply voltage node drops below a specified value. For example, a range of 10% of a nominal value may be specified as an acceptable range for a supply voltage carried on a voltage supply node. If the voltage falls more than 10%, it is considered a voltage droop in this example. Since a voltage droop can lead to undesirable operation of circuitry in a functional circuit block, it is desirable to prevent them, and if they occur, minimize their impact by resolving them as soon as possible. Voltage droops may occur for a number of reasons, such as voltage transients from the power supply or switching noise from a large number of circuits switching at substantially the same time.

The detection of a voltage droop by service processor 111 may be carried out by conducting comparison operations. In particular, the voltage present on a supply voltage node (as sensed by a sensor 120) may be compared to one or more voltage thresholds. If the voltage is below a particular threshold (e.g., more than 10% below a specified value), the presence of a voltage droop may be indicated. In some embodiments, the sensed voltage may be compared to a number of different thresholds, some of which may be within the specified range for the concerned supply voltage, while others are not. It is noted that the comparisons may be performed over successive clock cycles during operation of service processor 111. The clock cycles may be cycles of a clock signal that is provided to the corresponding functional circuit block, or another clock signal that is used for synchronizing the comparison operations.

In addition to the comparisons of the sensed voltages to corresponding thresholds, service processor 111 may also perform calculation of the rate of change of the supply voltage (i.e. its slope) over successive clock cycles. Using the calculated slope value, additional information can be determined. For example, the slope may be compared to one or more slope thresholds. If a voltage comparisons determine that the voltage is within range but close to the edge of its guard band, and the slope is below a certain threshold (i.e. downward trending), it may be an indication that a voltage droop is imminent even though it has not yet occurred. In another example, if a voltage comparison is just below the threshold of its minimum guard band, but the slope is above a certain threshold (indicating it is upward trending), it may be an indication that the voltage droop is close to being resolved and that the return of the supply voltage to its specified range is imminent.

Generally speaking, a combination of comparisons, including voltages to thresholds and slopes to slope thresholds may be used to determine the state of a voltage on a voltage supply node as well as the trend of the voltage toward or away from a voltage droop. These comparison results may be used by service processor 111 to generate digital codes that can be provided to PMU 115. The digital codes may indicate that no action is to be take or may indicate one or more specific actions to be taken to resolve a voltage droop and to minimize the impact of an imminent voltage droop. Responsive to receiving these digital codes, PMU 115 may perform various actions to minimize and/or resolve the voltage droop. For example, the amount of current provided to the corresponding functional circuit block (e.g., PU 130) may be increased, the frequency of a clock signal may be reduced, or the clock signal may be inhibited for a specified time. These actions, which may be performed singularly or in combination with one another are exemplary, and other actions not explicitly discussed herein may also be performed. In general, control actions may be carried out with the purpose of resolving a droop on voltage supply node such that the voltage is returned to within its specified range. Furthermore, the actions may be taken with a goal of preventing occurrence of voltage droops in some embodiments, thereby maintaining stability of the supply voltage on a supply voltage node.

MCC 105 also includes an instance of a sensor 120, as well as a reference sensor 107. Sensor 120 of MCC 105 is coupled to receive supply voltage Vdd3, (as are service processor 111 and memory 112). Furthermore, sensor 120 may be configured in accordance with the other instances of sensor 120 implemented on IC 10. Reference sensor 107 may receive its supply voltage from an analog voltage supply, AVdd. Reference sensor 107 in the embodiment shown may be a high accuracy sensor that is less susceptible to process, voltage, and temperature variations. Temperature readings from reference sensor 107 may be used as a reference during calibrations, or may be used to determine when recalibrations may be necessary.

Figure 2:
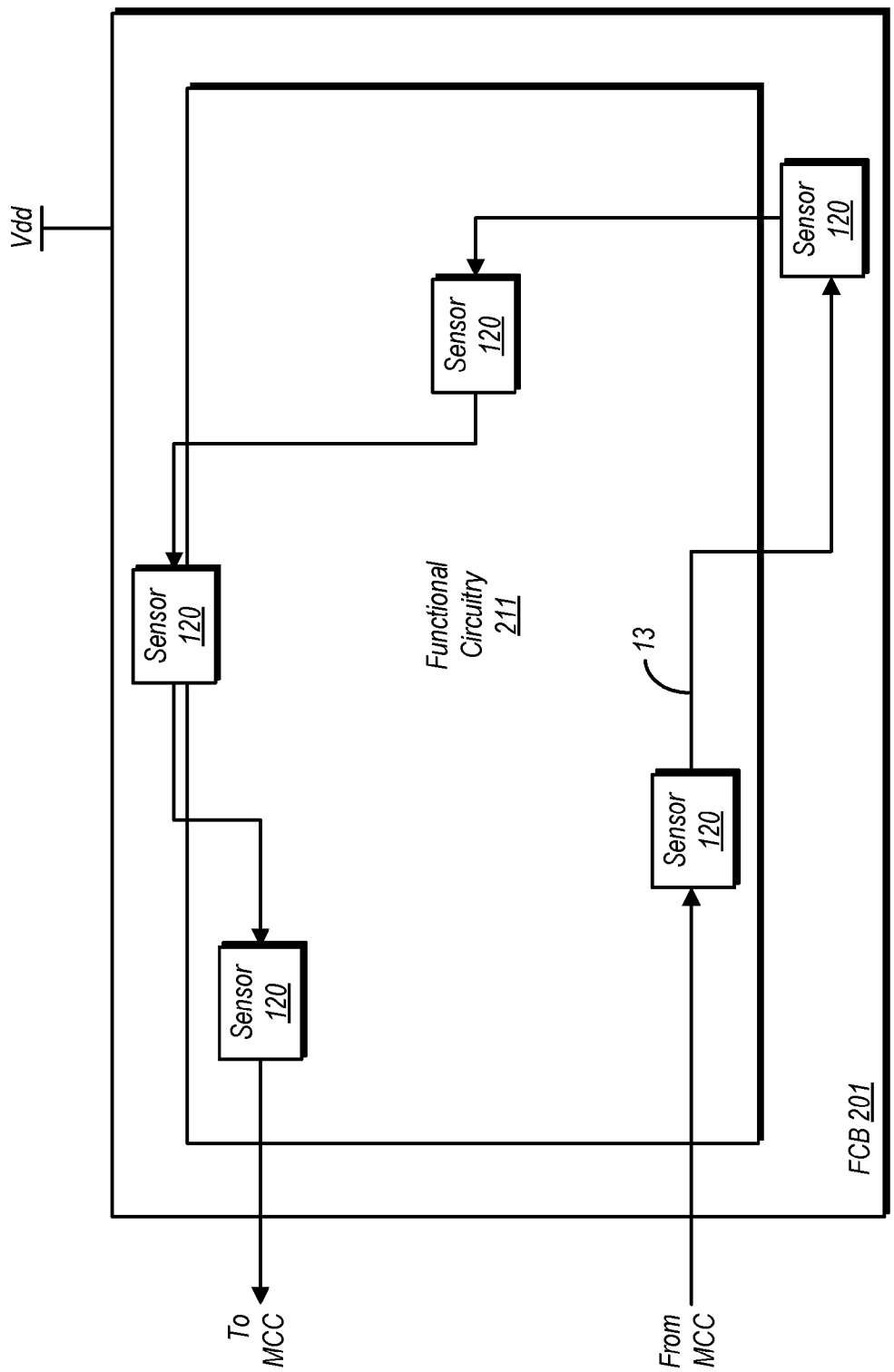
FIG. 2 is a block diagram of one embodiment of a functional circuit block having a number of sensors.

FIG. 2 is a block diagram of one embodiment of a functional circuit block having a number of sensors 120. In the embodiment shown, functional circuit block (FCB) 211 may be virtually any type of functional circuitry implemented on an IC. Included in functional circuitry 211 may be digital circuits, analog circuits, and mixed signal circuits. Sensors 120 of FCB 211 are implemented in various places in and around functional circuitry 211. Due to their relatively small footprint, at least some sensors 120 may be implemented within the area otherwise occupied by functional circuit 211, while others may be implemented near or partially within. The sensors 120 in this embodiment are coupled in a series configuration by metrology bus 13, through which data (e.g., frequency data for ring oscillators) may be shifted. Each of the sensors 120 in the embodiment shown is coupled to receive the same supply voltage, Vdd, as received by the functional circuitry 211.

Figure 3:
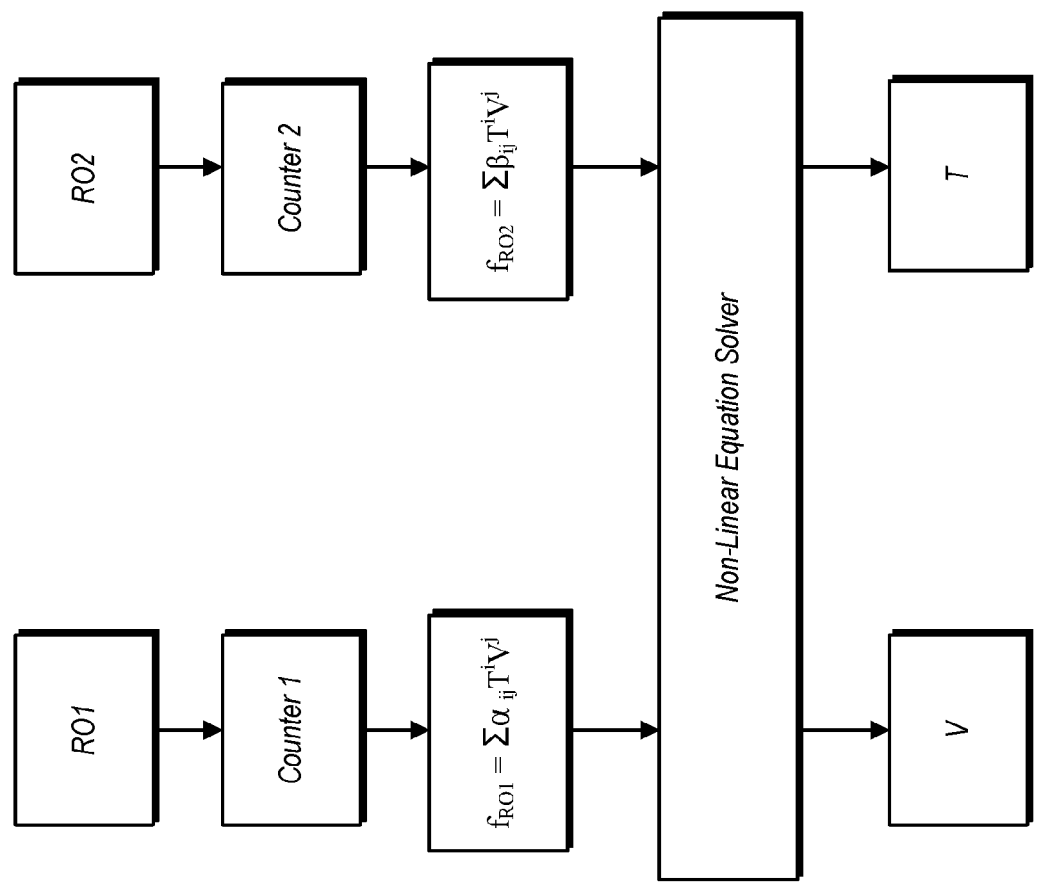
FIG. 3 is a block diagram illustrating an operational concept for an embodiment of a sensor employing two ring oscillators.

FIG. 3 is a block diagram illustrating an operational concept for an embodiment of a sensor employing two ring oscillators. In some embodiment, each sensor included two ring oscillators that are designed to have characteristics different from one another. The two ring oscillators may be implemented in close proximity to one another, and thus may operate under substantially the same voltage and temperature conditions. However, since their characteristics are different from one another, the two ring oscillators may operate at different frequencies under the same voltage and temperature conditions. This principle may enable the determination of voltage and temperature at the sensor using frequency readings from each of the ring oscillators.

In the illustrated example, two ring oscillators, RO1 and RO2 are coupled to Counter 1 and Counter 2, respectively. In taking a reading, each ring oscillator may be allowed to toggle its respectively coupled counter for a predetermined amount of time. After the predetermined time has elapsed, the counters may be frozen and their count values provided to indicate frequency.

Each of the ring oscillators may be characterized by a polynomial. More particularly, the frequency output by each ring oscillator may be characterized by a nonlinear function of voltage and temperature in a form given as shown in Equation 1:

$$f_{RO} = \Sigma \alpha_{ij} T^i V^j \quad (1)$$

Thus, the frequency of RO1 may be characterized as:

$$f_{RO1} = \Sigma \alpha_{ij} T^i V^j \quad (2),$$

while the frequency of RO2 may be characterized as:

$$f_{RO2} = \Sigma \beta_{ij} T^i V^j \quad (3).$$

The 'f' terms in the above equations may represent frequency, or alternatively, may represent a ratio of a product of the oscillating frequency and the number of phases to a reference frequency. The determination of the number of terms in this expression corresponding to a given ring oscillator is dependent on its characteristics. In general, a higher number of nonlinear terms increases the accuracy of representing the ring oscillator frequency with polynomials.

The output frequencies (or the product mentioned above) may be provided to a non-linear equation solver. Using the polynomials characterizing the ring oscillators, the simultaneous equations may be solved for both voltage and temperature as detected by the sensor. In one embodiment, the non-linear equation solver may be implemented using the service processor 111 (of FIG. 1) and software instruction executed thereby. More generally, the non-linear equation solver may be implemented using hardware, software, firmware, and any combination thereof. Moreover, it is possible and contemplated in some embodiments that the solving of the non-linear equations may be performed locally in the corresponding functional circuit blocks.

The coefficients in the equations above may be calculated based on actual ring oscillator frequencies for a given set of voltage and temperature values. Consider a model of a ring oscillator in which the frequency is defined using a 9-term function a set of 24 data points (voltage, temperature, and output frequency) used to calculate the ring oscillator characteristics. If a higher number of data points is used to determine coefficients, the resulting function may better characterize the corresponding ring oscillator. This technique may be referred to as surface fitting of the ring oscillator characteristic, and may use numerical techniques to map a large set of data points to a polynomial.

As an example, consider a frequency of a ring oscillator as being defined by the following expression:

$$f_{RO} = \alpha_{22}T^2V^2 + \alpha_{21}T^2V^1 + \alpha_{20}T^2V^0 + \alpha_{12}T^1V^2 + \alpha_{11}T^1V^1 + \alpha_{10}T^1V^0 + \alpha_{02}T^0V^2 + \alpha_{01}T^0V^1 + \alpha_{00}T^0V^0 \quad (4)$$

If measurements of ring oscillator frequency occur at $$\{(f_0,V_0,T_0),(f_1,V_1,T_1),\ldots,(f_{23},V_{23},T_{23})\},$$

then the following matrices can be formed:

$$F=[f_0 f_1 \ldots f_{23}] \quad (5)$$

$$A=[\alpha_{22}\alpha_{21}\alpha_{20}\alpha_{12}\alpha_{11}\alpha_{10}\alpha_{02}\alpha_{01}\alpha_{00}] \quad (6)$$

$$X=[X_0 X_1 \ldots X_{23}],$$

in which $X_j=$
$[T_j^2V_j^2 T_j^2V_j^1 T_j^2V_j^0 T_j^1V_j^2 T_j^1V_j^1 T_j^1V_j^0 T_j^0V_j^2 T_j^0V_j^1 T_j^0V_j^0]^T$ (7).

Accordingly, the frequency F can be defined as $F=AX$ (8). The term A can be solved for using Least Squares Estimation, computing all the coefficients in the original surface fit.

This concept can be expanded to two ring oscillators that have a different set of characteristics by characterizing each as described above. Accordingly, two ring oscillators placed in close proximity to one another, receiving the same supply voltage, and operating at substantially the same local temperature, can be characterized in two expressions as follows:

$$\begin{cases} f_{RO1} = \sum_{i,j} \alpha_{ij} T^i V^j \\ f_{RO2} = \sum_{i,j} \beta_{ij} T^i V^j \end{cases} \quad (9)$$

The above assumes that the two ring oscillators are characterized with polynomials having equal lengths, although this is not necessarily required for all instances.

The complexity of solving the simultaneous equations above may be reduced using a piecewise linear (PWL) technique. Using this technique, a two-dimensional nonlinear surface for the output frequency of a ring oscillator can be described using a set of PWL functions. The surface of operation over an entire voltage and temperature can be split into multiple triangular regions over each of which the characteristics of a corresponding can be described using a linear function of voltage and temperature. Thus, the overall surface may be broken into an integer number n of PWL regions, described as follows:

$$f = \begin{cases} a_{T1}T + a_{V1}V + a_{C1} & \text{for region 1} \\ a_{T2}T + a_{V2}V + a_{C2} & \text{for region 2} \\ \vdots \\ a_{Tn}T + a_{Vn}V + a_{Cn} & \text{for region } n \end{cases} \quad (10)$$

The coefficients for each of the PWL functions can be determined using the output frequencies at the three vertices of the triangle describing any given area. For example, for PWL function describing a triangle extending between temperatures T1 and T2 on a first axis and a voltages V1 and V2 on a second axis, with the frequencies measured at $(T_1,V_1)$, $(T_1,V_2)$, and $(T_2,V_1)$ respectively given by $f_1$, $f_2$, and $f_3$ and the index for the PWL is given as i, the following set of equations can be solved in order to compute the coefficients for the corresponding PWL function in that area:

$$\begin{cases} f_1 = a_{Ti}T_1 + a_{Vi}V_1 + a_{Ci} \\ f_2 = a_{Ti}T_1 + a_{Vi}V_2 + a_{Ci} \\ f_3 = a_{Ti}T_2 + a_{Vi}V_1 + a_{Ci} \end{cases} \quad (11)$$

This can be repeated for every region to determine its PWL characteristic, and thus to determine the surface of operation for the ring oscillator.

Once both ring oscillators have been characterized with a set of PWL function, solving the set of nonlinear equations is reduced to solving a set of PWL equations. The equations to be solved for each PWL computation may be generally described as follows:

$$\begin{cases} f_{RO1} = a_{Ti}T + a_{Vi}V + a_{Ci} \\ f_{RO2} = b_{Ti}T + b_{Vi}V + b_{Ci} \end{cases} \quad (12)$$

Solving these two equations for temperature, T, and voltage, V, results in the following:

$$\begin{cases} T = \dfrac{(f_{RO1} - a_{Ci})b_{Vi} - (f_{RO2} - b_{Ci})a_{Vi}}{a_{Ti}b_{Vi} - b_{Ti}a_{Vi}} = f_{RO1}\left(\dfrac{b_{Vi}}{a_{Ti}b_{Vi} - b_{Ti}a_{Vi}}\right) + \\ \qquad f_{RO2}\left(\dfrac{-a_{Vi}}{a_{Ti}b_{Vi} - b_{Ti}a_{Vi}}\right) + \left(\dfrac{a_{Vi}b_{Ci} - b_{Vi}a_{Ci}}{a_{Ti}b_{Vi} - b_{Ti}a_{Vi}}\right) \\ V = -\dfrac{(f_{RO1} - a_{Ci})b_{Ti} - (f_{RO2} - b_{Ci})a_{Ti}}{a_{Ti}b_{Vi} - b_{Ti}a_{Vi}} = f_{RO1}\left(\dfrac{-b_{Ti}}{a_{Ti}b_{Vi} - b_{Ti}a_{Vi}}\right) + \\ \qquad f_{RO2}\left(\dfrac{a_{Ti}}{a_{Ti}b_{Vi} - b_{Ti}a_{Vi}}\right) + \left(-\dfrac{a_{Ti}b_{Ci} - b_{Ti}a_{Ci}}{a_{Ti}b_{Vi} - b_{Ti}a_{Vi}}\right) \end{cases} \quad (13), (14)$$

As previously noted, the calculations discussed herein may be performed in MCC 105, and particularly in service processor 111. This may allow each sensor 120 to be implemented in a small area and limit its power consumption, since it need not perform any conversion of frequency to voltage and/or temperature. More generally, the features used for frequency measurement may be implemented within each sensor 120, while those features used for PWL computation, calibration against process variation, again, and accuracy may be implemented within MCC 105.

A surface fit of each ring oscillator (and thus its respective PWL representation) may change over each process corner and may also be subject to local on-die variations. Moreover, the accuracy of a given ring oscillator may be reduced due to effects such as aging. Accordingly, a calibration scheme used for such ring oscillators may update the characteristics of each. These characteristics may be updated based on a limited set of accurate measurements from each ring oscillator. If an original (but not accurate) model for a given ring oscillator is $$f_{RO\_precal} = \Sigma_{i,j} \alpha_{ij} T^i V^j \quad (15),$$

a set of actual measurements may be performed to update the coefficients such that a more accurate model of the ring oscillator is as follows:

$$f_{RO\_postcal} = \Sigma_{i,j} \alpha^*_{ij} T^i V^j \quad (16).$$

This calibration factors in both the original model and a set of calibration points. As the number of points increases, the accuracy increases correspondingly. Conversely, the efficiency of a calibration algorithm may be determined by the accuracy of the post-calibration model based on a smallest number of data points.

In one embodiment, a calibration algorithm in accordance with the disclosure includes updating the coefficients using a scaled value of the error signal at any calibration point. For any of the calibration points, the error signal (e) may be defined as the difference between the actual measurement and the value predicted by the model. That means $\forall k \in \{1, 2, \ldots, m\}$:

$$e_k = f_k - \Sigma_{i,j} \alpha_{ij} T_k^i V_k^j \qquad (17).$$

If the coefficients in the original model ($\alpha_{ij}$) are consolidated in a vector given as $A_0$, a recursive approach may be utilized in which the vector is updated for every single calibration point:

$$A_k = A_{k-1} + e_k G \qquad (18).$$

In one embodiment, the G vector may be determined using the Recursive Least Squares (RLS) technique. This may in turn result in a relatively fast convergence to final desired values based on a limited set of calibration data. In using the RLS technique, the G vector is recursively updated during each step. The RLS technique may utilize an alternate characterization of a ring oscillator as follows:

$$f_{RO_{precal}} = A_0 U^T \qquad (19),$$

wherein U is a vector of the (i+1)(j+1) terms, i.e.:

$$U = [T^i V^j T^{i-1} V^j \ldots T^0 V^0] \qquad (20).$$

From this, a diagonal matrix may be formed:

$$P_0 = \begin{bmatrix} \text{var}(U(1))^{-1} & 0 & & \\ 0 & \text{var}(U(2))^{-1} & \ldots & 0 \\ \vdots & & \ddots & \vdots \\ 0 & & \ldots & \text{dc} \end{bmatrix} \qquad (21)$$

For any calibration point, the following set of computations may be performed:

$$\begin{cases} r_k = \lambda + U P_{k-1} U^T \\ G_k = \dfrac{1}{r_k} P_{k-1} U^T \\ A_k = A_{k-1} + e_k G_k \\ P_k = \dfrac{1}{\lambda} P_{k-1} - \dfrac{1}{\lambda} G_k U P_{k-1} \end{cases} \qquad (22)$$

wherein $\lambda$ is a forgetting factor, and e is the error.

Accordingly, using a recursive least squares algorithm, such as that described above, the coefficients for a polynomial characterizing a ring oscillator may be updated during a calibration procedure. Such calibrations may be performed at various times, such as on a system startup, at selected times during the life of the system/IC, responsive to large variations in the reference sensor 107 and the sensor 120 in MCC 105, and so forth. As such, voltage and temperature, based on ring oscillator frequencies, may be determined with a reasonable level of accuracy over the life of the system, while enabling the use of simple sensors having a small area footprint.

Figure 4:
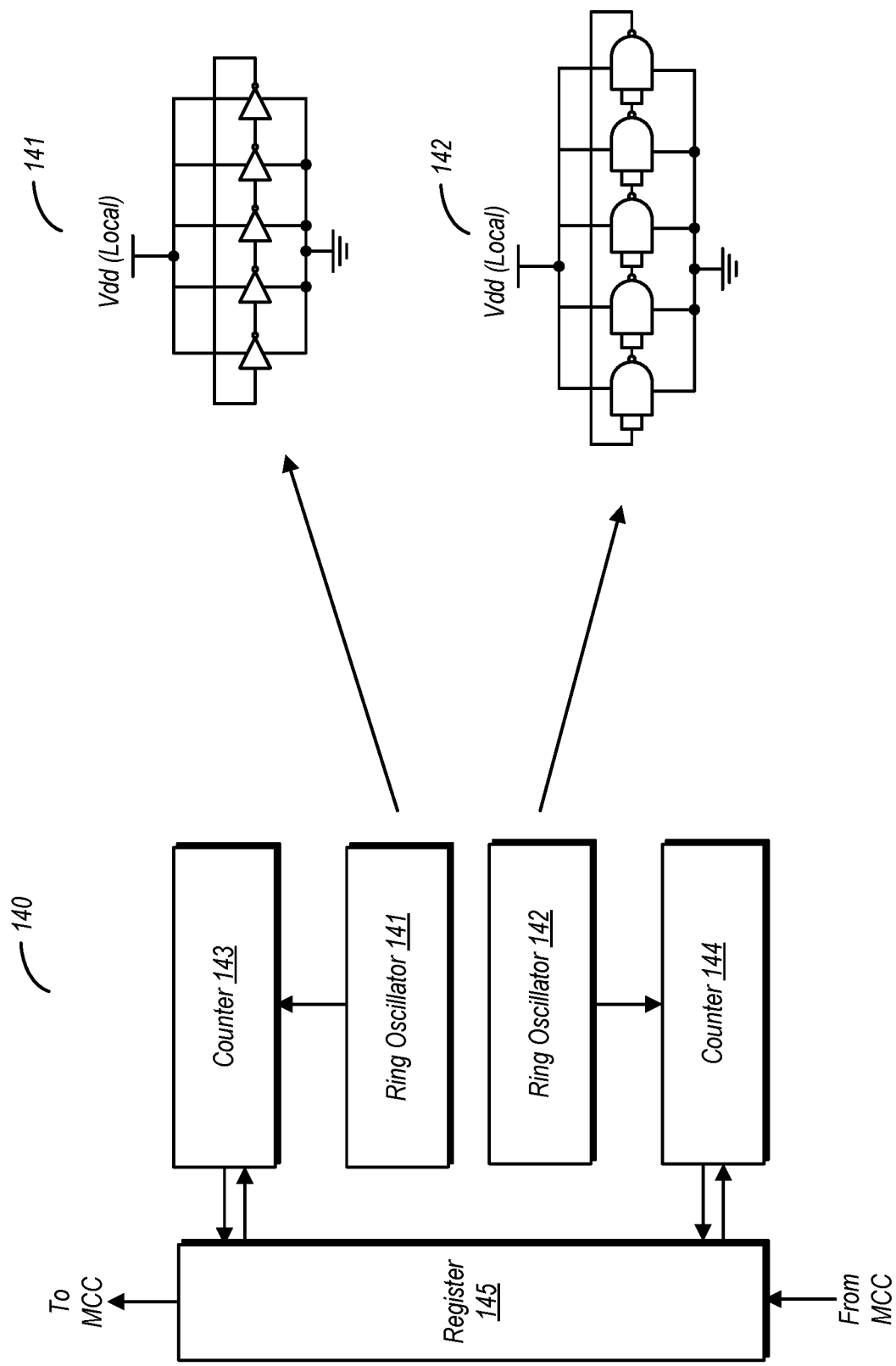
FIG. 4 is a block diagram of one embodiment of a sensor having two ring oscillators.

FIG. 4 is a diagram illustrating one embodiment of a sensor utilizing two ring oscillators. In the embodiment shown, sensor 140 includes ring oscillators 141 and 142, which may have different characteristics with respect to one another. In this particular embodiment, ring oscillator 141 is implemented using series-coupled inverters, while ring oscillator 142 is implemented using series-coupled NAND gates. Both of ring oscillators 141 and 142 are coupled to receive the same supply voltage, Vdd (Local), and are placed in close proximity to one another. However, due to the different circuit implementations, ring oscillators 141 and 142 may oscillate at different frequencies in identical operating conditions. In accordance with the discussion above, this may enable the respective frequencies produced by ring oscillators 141 and 142 to be the basis for solving for voltage and temperature at sensor 140.

Ring oscillators 141 and 142 are coupled to counters 143 and 144, respectively. These counters may be coupled to one or more tap points in their respectively coupled ring oscillators. During the taking of a measurement, counters 143 and 144 may track one or more count values that may in turn indicate the frequencies produced by ring oscillators 141 and 142, respectively. In some embodiments, each of counters 143 and 144 may include respective timer that track a run time for allowing counters to accumulate a count during a measurement. Other embodiments are possible and contemplated in which a separate timer coupled to both counters is provided.

Counters 143 and 144 are each coupled to register 144. Using register 144, MCC 105 (of FIG. 1) may input information into the counters, and may also receive information therefrom. For example, information indicative of a run time for a counter to track a count value produced by the oscillation of a correspondingly coupled ring oscillator may be input into the counters, from MCC 105, via register 145. A start indication may also be input through register 145. From counters 143 and 144, register 145 may receive the count values produced during an actual measurement. In accordance with the embodiment shown in FIG. 1, these values may be serially shifted through metrology bus 13 to MCC 105 for use in computing the voltage and temperature values. Embodiments in which register 145 is directly coupled to an implementation of MCC 105 are also possible and contemplated.

Figure 5:
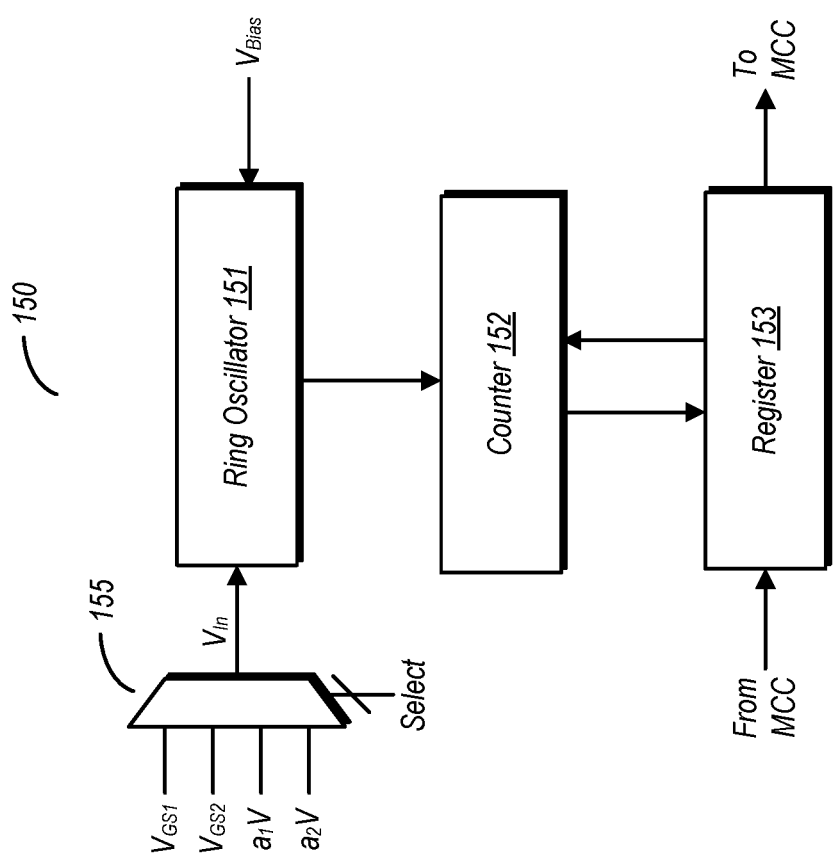
FIG. 5 is a block diagram of one embodiment of a sensor having a single ring oscillator.

FIG. 5 is a diagram illustrating one embodiment of a sensor utilizing a single ring oscillator. Using this type of sensor, voltage and temperature may be determined using a multi-sensing technique in which measurements are taken using a single ring oscillator with measurements performed at different input voltages. Ring oscillator 151 in this particular embodiment is coupled to receive a bias voltage, $V_{Bias}$, and a selectable input voltage, $V_{in}$. The bias voltage may be generated by any suitable circuitry for generating such a voltage, and may be substantially the same for all measurements. The circuitry for generating the bias voltage may be local to the sensor, or may be generated globally and distributed to each of the sensors. The input voltage, $V_{in}$, may be any one of the voltage input through selection circuit 155. Generation of these voltages for one embodiment is further described below in reference to FIG. 6. Control of the selection signal for selecting these voltages may be performed by MCC 105.

Ring oscillator 151 in the embodiment shown is coupled to counter 152 via one or more tap points, and may cause the counter to toggle when operating. Counter 152 may thus track the count value, and at the end of a predetermined period, may discontinue counting and provide the count value to register 153. The count value may then be forwarded to MCC 105 for voltage and temperature computation. Similarly, counter 152 may receive information from MCC 105, via register 153, in a manner similar to that described above with reference to the embodiment of FIG. 4.

Ring oscillator 151 may be characterized by a polynomial in a manner similar to that described above with reference to FIG. 3. The technique may involve a surface fitting technique for multiple frequency measurements at multiple voltages and frequencies. That is, the frequency response of ring oscillator 151, in terms of voltage and temperature, can be characterized per equations (1) and (4) above.

To perform voltage and temperature measurements, frequency measurements may be made at the four different input voltages provided through selector 155. The following frequency measurements may be made:

$$\text{for } V_{in} = V_{GS1} f_1 = f_0 + K_{VCO}(V_{GS1} - V_0) \quad (23),$$

$$\text{for } V_{in} = V_{GS2} f_2 = f_0 + K_{VCO}(V_{GS2} - V_0) \quad (24),$$

$$\text{for } V_{in} = a_1 V f_3 = f_0 + K_{VCO}(a_1 V - V_0) \quad (25), \text{ and}$$

$$\text{for } V_{in} = a_2 V f_4 = f_0 + K_{VCO}(a_2 V - V_0) \quad (26).$$

The above set of equations assume that $a_1 V$ and $a_2 V$ are chosen to be close to $V_{GS1}$ and $V_{GS2}$ so that the same linearized model of the ring oscillator (i.e. $K_{VCO}$, $V_0$, and $f_0$) can be used for all of them.
From the above measurement, the following equation may be deduced:

$$(f_4 - f_3)/(f_2 - f_1) = (a_2 - a_1) V/(V_{GS1} - V_{GS2}) \quad (27).$$

In the subthreshold region $V_T \ln N$, and $V_T$ can be rewritten as $kT/q$. Accordingly, equation 25 can be rewritten as $$(f_4 - f_3)/(f_2 - f_1) = (a_2 - a_1) V/(kT/q) \ln N \quad (28).$$

From this, the ring oscillator characterization can be reduced to:

$$f_{RO} = \Sigma \beta_{ij} T^i T^j \quad (29).$$

Using equation 27, temperature T can be solved for and plugged back into the polynomial characterization to solve for voltage V.

For calibration using ATE, frequencies may be determined at two temperatures and two supply voltages. Linear interpolation may be used for other measured frequencies. Additional frequency measurements may improve the surface fit. During operation, additional measurements may be taken, with the results used to replace interpolated values until a desired number have been replaced. This in turn may improve the accuracy of measurements taken during normal operation.

Figure 6:
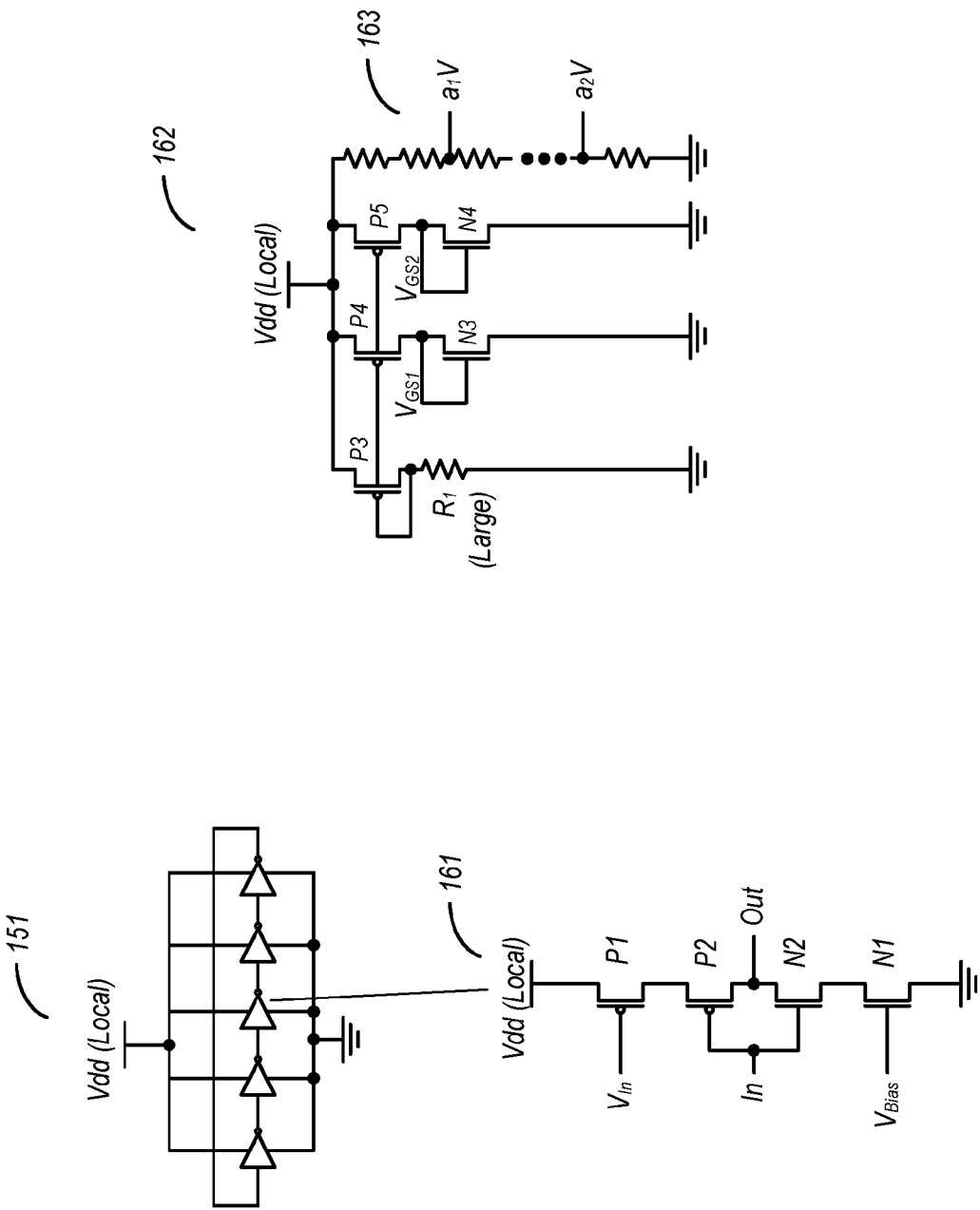
FIG. 6 is a schematic diagram of one embodiment of circuitry used in implementing a ring oscillator.

FIG. 6 includes schematic diagrams of circuit elements used in and with a sensor 120. In the embodiment shown, ring oscillator 151 includes a number of serially-coupled inverters 161. Each inverter 161 includes a stack of two PMOS (p-channel metal oxide semiconductor) and two NMOS (n-channel metal oxide semiconductor) transistors. The PMOS stack includes P1 and P2, while the NMOS stack includes N1 and N2. During operation, the gate terminal of P1 receives one of the input voltages discussed above in reference to FIG. 5. Similarly, N1 receives the bias voltage $V_{Bias}$ on its respective gate terminal. P2 and N2 each have respective gate terminals coupled to the input node and respective drain terminals coupled to the output node. Accordingly, P2 and N2 operate to perform the actual inverter functions. N1 operates to set characteristics of the inverter, while P1 operates, via the different values of $V_{in}$, to vary the characteristics of the inverter. Each inverter 161 of ring oscillator 151 may be configured in this manner. In varying the input voltage provided to P1 of each of the inverters 161, the characteristics of and thus frequency output by ring oscillator 151 may be varied. This in turn may allow for calibrations and measurements to be performed to determine the temperature and voltage (i.e. the supply voltage) detected by each sensor.

Reference circuit 162 in the embodiment shown is configured to generate the various voltages that may be provided as $V_{in}$ to P1 of each inverter 161. The circuit includes PMOS transistors P3, P4, and P5, and NMOS transistors N3 and N4. Transistor P3 is coupled between Vdd (Local) and resistor R1, which has a relatively large resistance value. This resistor sets the gate voltage for P3, P4, and P5. Voltages $V_{GS1}$ and $V_{GS2}$ are taken from the drain terminals of P4 and P5, respectively. The relative sizing of P4 to P5 is 1:N, and thus voltages $V_{GS1}$ and $V_{GS2}$ are different (this is also the source of the 'N' term in equation 26). Using a large resistance value for R1 ensures that the current flowing through N3 and N4 is very small and thus devices operate in subthreshold region. This guarantees that the difference between $V_{GS1}$ and $V_{GS2}$ is a proportional to absolute temperature (PTAT) voltage. The other two voltages, $a_1 V$ and $a_2 V$, are produced from tap points on resistor ladder 163.

Reference circuit 162 may be implemented in various ways. In one embodiment, each sensor may include a reference circuit 162 dedicated thereto. In another embodiment, each functional circuit block may have a reference circuit 162 that provides these voltages to the ring oscillator 151 of each sensor. In yet another embodiment, each different voltage supply (or voltage rail) may associated with on reference circuit 162, which distributes the various voltages to each ring oscillator 151 that receives it supply voltage from the same source.

Figure 7:
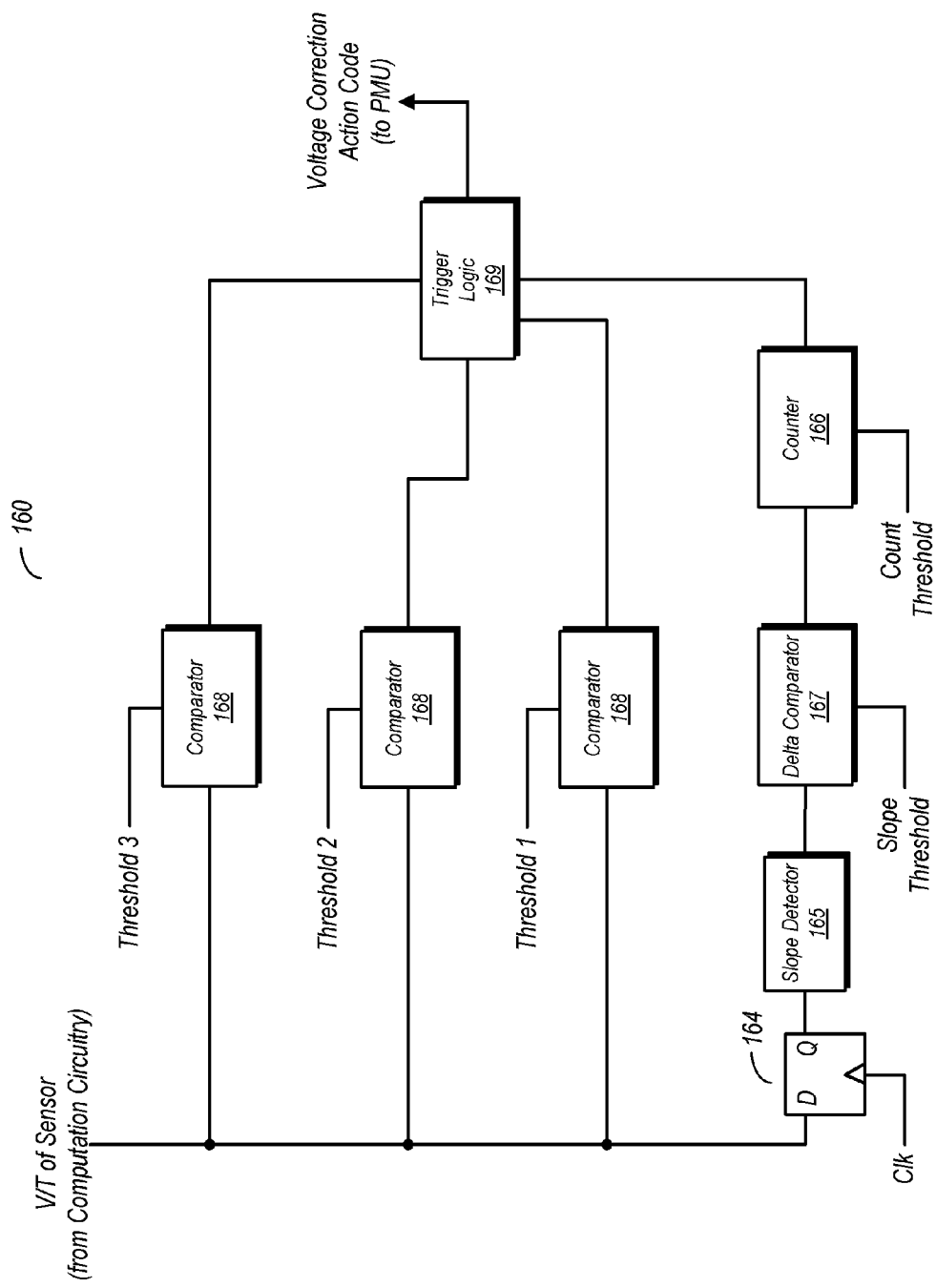
FIG. 7 is a block diagram of one embodiment of a comparator unit including voltage threshold comparison circuitry and delta comparison circuitry.

Turning now to FIG. 7, a block diagram of one embodiment of a comparator unit is shown. Comparator unit 160 may be implemented as hardwired circuitry in one embodiment. In another embodiment, comparator unit 160 may be implemented using a combination of circuitry and firmware. In yet another embodiment, comparator unit 160 may be implemented in, e.g., service processor 111 with processing circuitry and software instructions executed thereby. In general, comparator unit may be implemented using any suitable combination of hardware, software, and/or firmware.

The embodiment shown in FIG. 7 includes a delta comparator 167 and three comparators 168. The number of comparators 168 shown here is exemplary, and other embodiments may implement a greater or lesser number of the same. The comparators 168 may be used to compare a voltage reading (received in a digital format) to a corresponding threshold value. Each comparator 168 shown here compares the received voltage to a different threshold. For example, a first threshold may be within a guard band for a supply voltage, but relatively close to the edge thereof. A second threshold may be outside of the guard band and lower than the first. The third threshold may be lower than the second threshold. By comparing the received voltage value to these thresholds, the presence of an undervoltage (or voltage droop) condition may be detected, as well as its severity.

The voltage readings are also provided for performing slope comparisons to determine the rate and direction of change of the supply voltage from one clock cycle to the next. Comparator unit 160 in the embodiment shown includes a clocked storage element 164 coupled to receive the voltage value provided in digital format. On each clock cycle, clocked storage element may output a received voltage value to slope detector 165. Slope detector 165 may store at least the two most recently received voltage values and perform a comparison between the two in order to determine the magnitude and direction of any change of the voltage. For example, a negative slope may indicate the voltage is falling, while a positive slope may indicate the voltage is rising. The slope is provided to the delta comparator 167, which may compare the slope to a slope threshold. The comparison result may be provided to a counter 166, which may count the number of cycles that the slope is below the threshold. Counter 166 may also compare the count value to a count threshold.

It is noted that in some embodiments, multiple instances of delta comparator 168 may be implemented, and multiple counters may be implemented and perform the same function as discussed above.

The output of comparators 168 and counter 166 may be provided to trigger logic 169. In the embodiment shown, trigger logic 168 may aggregate the results of the various comparisons and determine if one or more voltage correction actions are to be taken to bring the voltage to within specified limits. Furthermore, trigger logic 169 may also determine the type or types of actions to be taken to bring the voltage back to within its specified limits. The resulting output may be a digital code that is provided to PMU 115, which may then generate additional signals to cause the voltage correction action(s) to be carried out.

The actions performed to bring the voltage back to within a specified range may vary depending on the various comparison results. For example, comparison results indicating that the voltage is within its specified limits but has had a negative slope for a certain amount of time, it may indicate that a voltage droop is either likely or imminent. Accordingly, trigger logic 169 may generate a first digital code responsive to detecting such a condition, indicative of a first voltage correction action to be taken by PMU 115. For example, the code could indicate for PMU 115 to reduce the clock frequency to arrest or minimize the voltage droop, holding the frequency at the reduced value until the voltage is well within specified limits.

In another situation, the comparison may indicate that the voltage is significantly out of its guard band and the slope has been negative enough time to exceed threshold. This in turn may indicate a relatively severe voltage droop. In this case, trigger logic 169 may generate a code that results in PMU 115 performing multiple actions to correct the condition. For example, PMU 115 could generate signals to cause a power supply or voltage regulator to increase the amount of current provided to the corresponding functional circuitry, while also performing a frequency reduction of the clock signal provided thereto.

In yet a third example, the comparison results may indicate that the voltage is outside of its specified guard band, while the counter indicates that the slope has not been negative for a time exceeding the count threshold (or alternatively, another delta comparator may indicate that the slope is positive, indicating the voltage is rising). This may indicate either that a current voltage droop is less severe, or if corrective actions had previously been taken, that the droop is being resolved. If no previous actions had been taken, trigger logic 169 may generate a digital code to cause PMU 115 to generate signals for performing a single action, such as throttling the corresponding functional circuit block or increasing an amount of current provided thereto. Alternatively, if a voltage droop condition previously existed and a digital code to perform multiple actions had been generated, trigger logic 169 may in this situation change the digital code to discontinue performing one of the actions.

In general, trigger logic 169 may be configured in a number of different ways to indicate voltage correction actions to be carried out for a number of different conditions. The conditions may be based on a combination of comparisons, including one or more comparisons of a voltage to a voltage threshold, one or more comparisons of a slope to a slope threshold, and one or more comparisons of a count of time that the slope threshold has been exceeded to a count threshold.

Figure 8:
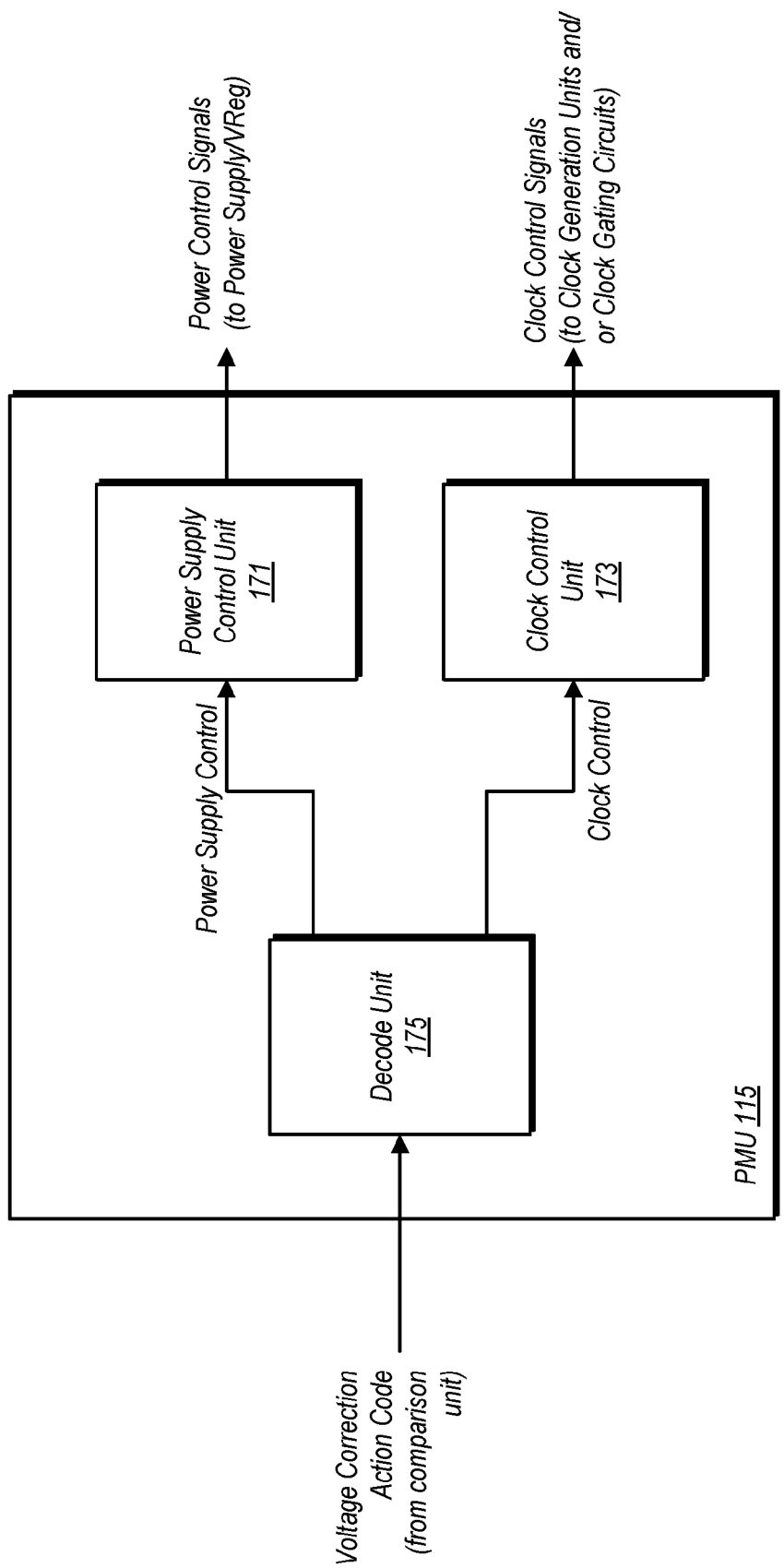
FIG. 8 is a block diagram of one embodiment of a power management circuit.

Turning now to FIG. 8, one embodiment of PMU 115 is shown. In the embodiment shown, PMU 115 includes a decode unit 175 coupled to receive a voltage correction action code (i.e. a digital code) from comparison unit 160. Decode unit 175 may perform a decode operation to determine the type of action or actions, if any, that are to be performed.

If the voltage correction action involves a power supply and/or voltage regulator, decode unit may provide corresponding power supply control signals to power supply control unit 171. Power supply control unit 171 may responds by generating power supply control signals that cause a power supply and/or voltage regulator to perform one or more supply voltage related actions (e.g., increasing the current flow).

If a received voltage correction action code indicates a clock control action is to be performed, decode unit 175 may generate clock control signals that are provided to clock control unit 173. The clock control unit 173 may respond by generating clock control signals that are provided to a clock generation unit and/or one or more clock gating circuits. The actions may include inhibiting the clock signal at one or more clock gating circuits in various levels of a clock tree, changing a frequency (either at the source or by manipulating clock gating circuits), or inhibiting a clock signal provided to a corresponding functional circuit block altogether for a predetermined time period.

Figure 9:
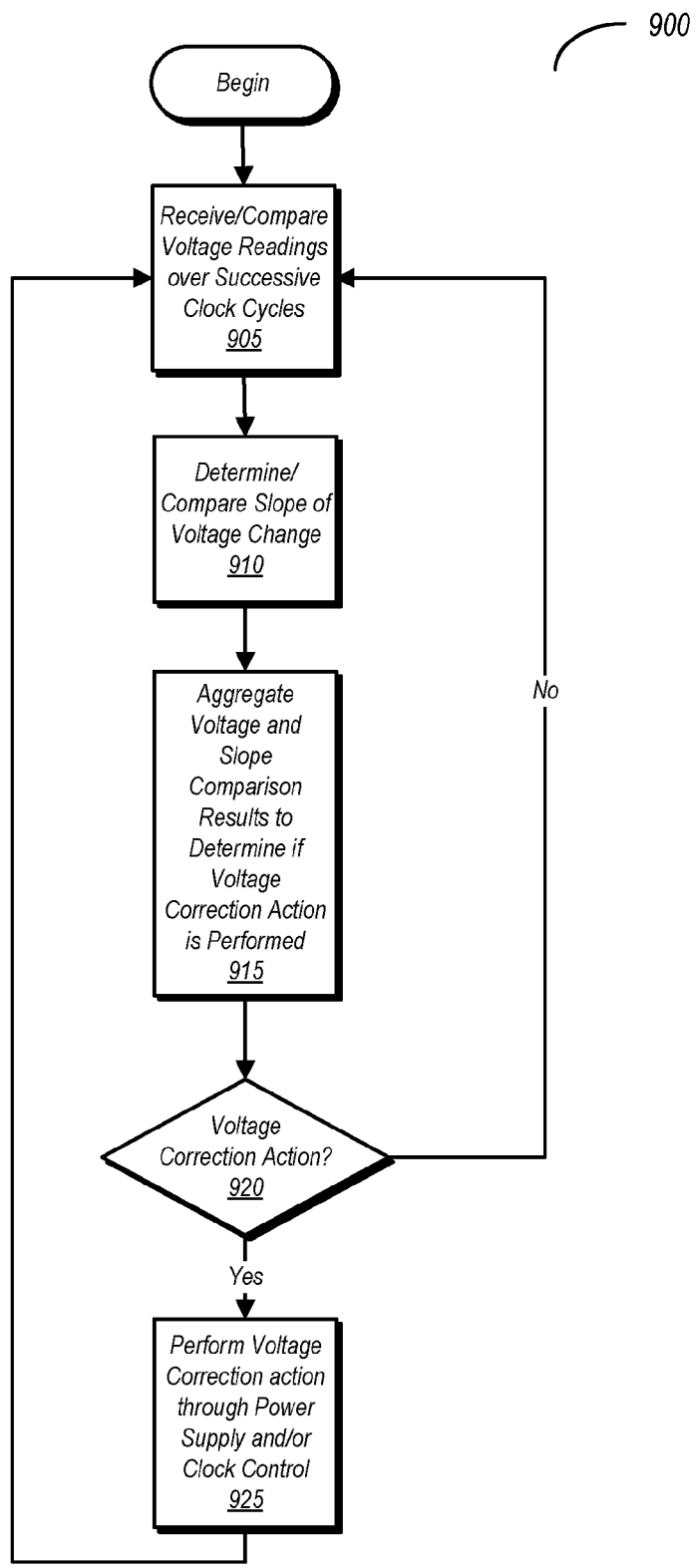
FIG. 9 is a flow diagram illustrating one embodiment of a method for determining the presence of and correcting of a digital undervoltage condition.

Turning now to FIG. 9, a flow diagram illustrating one embodiment of a method for determining the presence of and correcting of a digital undervoltage condition. Method 900 may be performed using various hardware/software/firmware embodiments such as those discussed above. Additionally, method 900 may be performed with other embodiments not explicitly discussed herein.

Method 900 begins with the receiving and comparison of voltage readings over successive clock cycles (block 905). The sensors may be implemented using ring oscillators, and the sensed voltage may be calculated based on a frequency output by each of the ring oscillators, in addition to their characteristics as indicated by corresponding polynomials. The calculated voltage values may be compared for one or more voltage threshold values.

This may be ongoing during the operation of the system in which the apparatus that carries out the method is implemented. Method 900 further includes comparing the slope of the voltage change to a slope threshold (block 910). This may indicate whether the voltage is moving toward or away from its nominal specified value. The slope may be determined just prior to the comparison, and may have a magnitude and direction value. An optional count comparison operation may also be performed in conjunction with the slope comparison to track an amount of time that the slope has been, e.g., negative with respect to the threshold value.

The results of each of the comparisons may be aggregated to determine if any voltage correction action is to be performed (block 915). This portion of method 900 may also include determination of the type or types of actions to be performed in order to correct a voltage droop. As noted above, a number of different actions may be performed, and these actions may include various combinations of controlling a clock signal and controlling the output of a power supply and/or voltage regulator. If no voltage correction action is to be taken (block 920, no), then method 900 returns to block 905, with the continued receiving of voltage values on each clock cycle and the performing of the comparisons based thereon. If a voltage correction action is to be performed (block 920, yes), a power management unit may perform the action via power supply control and/or clock control (block 925).

Figure 10:
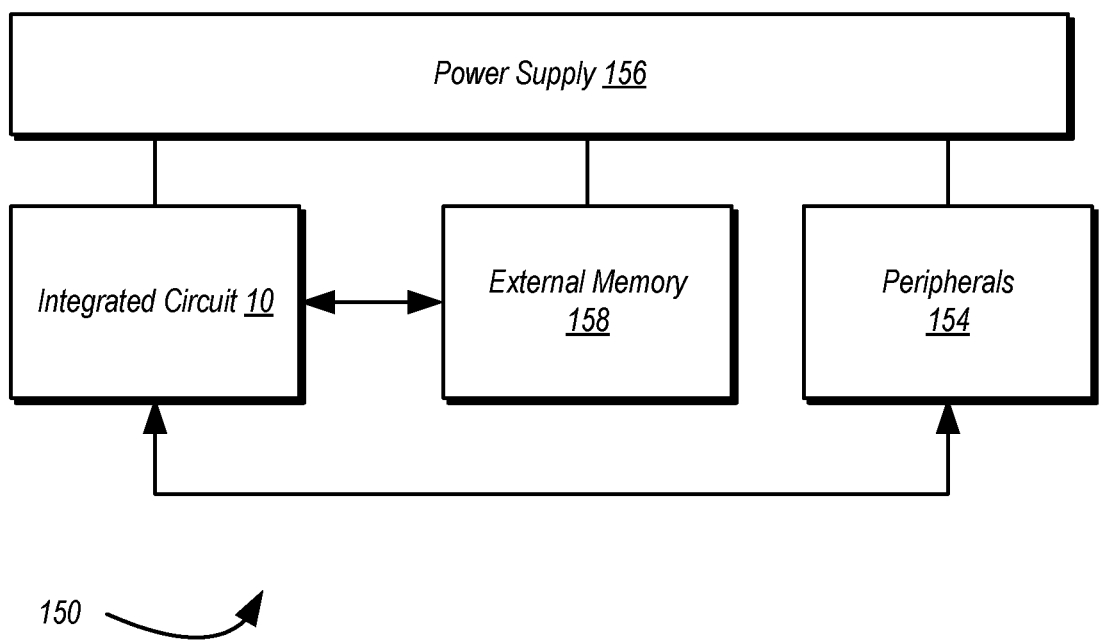
FIG. 10 is a block diagram of one embodiment of an exemplary system.

Turning next to FIG. 10, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
 a sensor configured to detect a voltage present on a voltage supply node over each of first and second successive clock cycles, wherein the sensor includes first and second ring oscillators having difference characteristics with respect to one another, wherein each of the first and second ring oscillators is coupled to provide respective frequency information to a computation circuit, wherein the computation circuit is configured to calculate the voltage at each of the first and second successive clock cycles based on the frequency information received from each of the first and second ring oscillators;
 comparison circuitry configured to compare the voltages detected at each of the first and second successive clock cycles to each of a plurality of voltage thresholds;
 a delta comparator configured to compare a rate of change of the voltage present on the voltage supply node from the first clock cycle to the second clock cycle to one or more slope threshold; and
 control circuitry configured to determine if one or more voltage corrections action are to be taken based on comparisons performed by the comparison circuitry and the delta comparator, and further configured to perform the one or more voltage correction actions responsive to determining that at least one voltage correction action is to be taken.

2. The integrated circuit as recited in claim 1, wherein the comparison circuitry includes:
 a first comparator configured to compare a voltage detected at one of the first and second clock cycles to a first voltage threshold; and
 a second comparator configured to compare the voltage detected at of the first and second clock cycles to a second voltage threshold, wherein the second voltage threshold is different from the first voltage threshold.

3. The integrated circuit as recited in claim 1, wherein the comparison circuitry and the delta comparator are configured to continue performing respective comparisons subsequent to the performing a voltage correction action.

4. The integrated circuit as recited in claim 3, wherein the control circuitry is configured to discontinue, based on information received from the comparison circuitry and the delta comparator, performing at least one of the one or more voltage correction actions responsive to determining that the at least one voltage correction action is successful.

5. The integrated circuit as recited in claim 1, wherein performing one or more voltage correction actions comprises performing one or more of the following:
 throttling a functional circuit block in which the sensor is implemented;
 performing adaptive clocking of the functional circuit block in which the sensor is implemented; and
 increasing an amount of current supplied to the functional circuit block in which the sensor is implemented.

6. The integrated circuit as recited in claim 1, wherein the control circuitry is configured to perform a first voltage correction action responsive to the voltage being less than at least a first threshold and the rate of change exceeding a first slope threshold.

7. The integrated circuit as recited in claim 6, wherein the control circuitry is configured to perform a second voltage correction action responsive to the voltage being less than at least the first threshold and the rate of change being less than the first slope threshold.

8. The integrated circuit as recited in claim 7, wherein the control circuitry is configured to perform a third voltage correction action responsive to the voltage being less than at least the first voltage threshold and the rate of change being less than a second slope threshold.

9. The integrated circuit as recited in claim 1, wherein each of the first and second ring oscillators is characterized by a respective polynomial, wherein the computation circuit is configured to determine the voltage detected by the sensor by solving for voltage and temperature using the frequencies of operation of the first and second ring oscillators and the respective polynomials characterizing each of the first and second ring oscillators.

10. A method comprising:
 determining respective voltages on a voltage supply node over first and second successive clock cycles, wherein the voltage is determined by a sensor having a computation circuit configured to calculate the voltage based on respective frequencies of first and second ring oscillators having different characteristics with respect to one another;
 comparing the respective voltages to each of a plurality of voltage thresholds;
 determining a rate of change of the voltage based on the voltages detected on the voltage supply node for each of the first and second successive clock cycles;
 comparing the rate of change of the voltage to one or more slope thresholds; and
 determining if one or more voltage correction actions is to be performed by control circuitry based on results from comparing the respective voltages to plurality of voltage threshold and the one or more slope thresholds.

11. The method as recited in claim 10, further comprising:
 a first comparator circuit comparing a voltage detected at one of the first and second clock cycles to a first voltage threshold; and
 a second comparator circuit comparing the voltage detected at one of the first and second clock cycles to a second voltage threshold, wherein the second voltage threshold is different from the first voltage threshold.

12. The method as recited in claim 10, further comprising:
 performing a voltage correction action based on results from comparing the respective voltages to plurality of voltage threshold and the one or more slope thresholds, wherein a voltage correction action comprises performing actions to return the voltage present on the voltage supply node to within a specified range.
 continuing comparing the respective voltages to each of a plurality of voltage thresholds and determining a rate of change of the voltage based on the voltages detected on the voltage supply node for each of the first and second successive clock cycles subsequent to performing the voltage correction action.

13. The method as recited in claim 12, further comprising discontinuing performing a voltage correction action responsive to an indication that the voltage present on the voltage supply node has returned to within the specified range.

14. The method as recited in claim 10, wherein performing the voltage correction action comprises performing one or more of the following:
 throttling a functional circuit block in which the sensor is implemented;
 performing adaptive clocking of the functional circuit block;
 increasing an amount of current supplied to the functional circuit block.

15. The method as recited in claim 10, further comprising:
 performing, using the control circuitry, a first voltage correction action responsive to the voltage being less than at least a first threshold and the rate of change exceeding a first slope threshold;
 performing, using the control circuitry, a second voltage correction action responsive to the voltage being less than at least the first threshold and the rate of change being less than the first slope threshold; and
 performing, using the control circuitry, a third voltage correction action responsive to the voltage being less than at least the first voltage threshold and the rate of change being less than a second slope threshold.

16. The method as recited in claim 10, wherein each of the first and second ring oscillators is characterized by a respective polynomial, wherein the method further comprises the computation circuit determining the voltage detected by the sensor by solving for voltage and temperature using the frequencies of operation of the first and second ring oscillators and the respective polynomials characterizing each of the first and second ring oscillators.

17. An integrated circuit comprising:
 a plurality of functional circuit blocks;
 a plurality of sensors, wherein each of the plurality of functional circuit blocks includes at least one of the plurality of sensors, wherein each of the plurality of sensors is configured to detect a voltage present, on a voltage supply node coupled to its respective functional circuit block, over each of first and second successive clock cycles, wherein each of the plurality of sensors includes:
  at least one ring oscillator characterized by a polynomial, wherein the at least one ring oscillator is coupled to provide frequency information to a computation circuit, wherein the computation circuit is configured to calculate the voltage at each of the first and second successive clock cycles based on the frequency information received from the at least one ring oscillator;
 comparison circuitry configured to compare the voltages detected at each of the plurality of sensors over each of the first and second successive clock cycles to each of a plurality of voltage thresholds;
 delta comparator circuitry configured to, for each of the plurality of sensors, compare a rate of change of the voltage present on its corresponding voltage supply node from the first clock cycle to the second clock cycle to one or slope thresholds; and
 control circuitry configured to, for each of the plurality of sensors, determine if one or more voltage corrections action are to be taken based on comparisons performed by the comparison circuitry and the delta comparator, and further configured to perform the one or more voltage correction actions responsive to determining that at least one voltage correction action is to be taken.

18. The integrated circuit as recited in claim 17, wherein each of the plurality of sensors includes a first ring oscillator and a second ring oscillator, wherein each of the first and second ring oscillators is coupled to provide respective frequency information to the computation circuit, wherein the computation circuit is configured to calculate the voltage at each of the first and second successive clock cycles based on the frequency information received from each of the first and second ring oscillators.

19. The integrated circuit as recited in claim 18, wherein each of the plurality of sensors is implemented using a single ring oscillator implemented using a plurality of series-coupled inverters each of which includes first and second transistors having respective gate terminals coupled to an inverter input and respective drain terminals coupled to an inverter output, wherein each of the series-coupled inverters includes a third transistor coupled between the first transistor and a local voltage supply node, and a fourth transistor coupled between the second transistor and a reference node, wherein the third transistor includes a respective gate terminal coupled to receive a variable input voltage, and wherein the fourth transistor includes a respective gate terminal coupled to receive a variable bias voltage;
   wherein the computation circuit is configured to determine a voltage detected by the ring oscillators based on a frequency of operation of the ring oscillators and a corresponding polynomial characteristic of the ring oscillators.

20. The integrated circuit as recited in claim 17, wherein the control circuitry is configured to:
   perform a first voltage correction action responsive to the voltage being less than at least a first threshold and the rate of change exceeding a first slope threshold;
   perform a second voltage correction action responsive to the voltage being less than at least the first threshold and the rate of change being less than the first slope threshold; and
   perform a third voltage correction action responsive to the voltage being less than at least the first voltage threshold and the rate of change being less than a second slope threshold.

* * * * *

UNITED STATES PATENT AND TRADEMARK OFFICE
CERTIFICATE OF CORRECTION

PATENT NO. : 9,825,620 B2  
APPLICATION NO. : 15/002495  
DATED : November 21, 2017  
INVENTOR(S) : Sotirios Zogopoulos et al.

Page 1 of 1

It is certified that error appears in the above-identified patent and that said Letters Patent is hereby corrected as shown below:

On the Title Page

In Item (57) Abstract:  
Line 1, please delete "method and apparats" and insert --method and apparatus--.

Signed and Sealed this  
Twenty-second Day of May, 2018

Andrei Iancu  
*Director of the United States Patent and Trademark Office*